(12) United States Patent
Kubo

(10) Patent No.: US 8,958,445 B2
(45) Date of Patent: Feb. 17, 2015

(54) DC-COUPLED LASER DRIVE CIRCUIT AND METHOD FOR DRIVING LASER DIODE DEVICE

(71) Applicant: Fujikura Ltd., Koto-Ku, Tokyo (JP)

(72) Inventor: Tatsuo Kubo, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/855,419

(22) Filed: Apr. 2, 2013

(65) Prior Publication Data

US 2014/0233594 A1 Aug. 21, 2014

Related U.S. Application Data

(63) Continuation of application No. PCT/JP2012/074439, filed on Sep. 24, 2012.

(30) Foreign Application Priority Data

Jan. 25, 2012 (JP) ................. 2012-013544

(51) Int. Cl.
*H01S 5/026* (2006.01)
*H01S 5/042* (2006.01)
*H01S 5/068* (2006.01)

(52) U.S. Cl.
CPC ............. *H01S 5/0261* (2013.01); *H01S 5/0428* (2013.01); *H01S 5/06808* (2013.01)
USPC ................ 372/29.012; 372/38.01; 372/38.02; 372/38.07

(58) Field of Classification Search
CPC ....... H01S 5/042; H01S 5/0427; H01S 5/026; H01S 5/0261

USPC .................... 372/38.01, 38.02, 38.07, 29.012
See application file for complete search history.

(56) References Cited

U.S. PATENT DOCUMENTS

| 6,137,816 | A | 10/2000 | Kinbara |
| 6,765,942 | B2 | 7/2004 | Robertson |
| 6,879,608 | B1 * | 4/2005 | Schuelke et al. ........... 372/38.02 |
| 2011/0164636 | A1 * | 7/2011 | Tanaka ....................... 372/38.02 |

FOREIGN PATENT DOCUMENTS

| CN | 1211094 A | 3/1999 |
| CN | 102064463 A | 5/2011 |
| JP | 5-218543 A | 8/1993 |
| JP | 10-145221 A | 5/1998 |
| JP | 2000-269590 A | 9/2000 |
| JP | 2010-267799 A | 11/2010 |
| JP | 2011-142173 A | 7/2011 |
| TW | 200919880 A | 5/2009 |

OTHER PUBLICATIONS

International Search Report for PCT/JP2012/074439 dated Oct. 16, 2012.

(Continued)

*Primary Examiner* — Yuanda Zhang
*Assistant Examiner* — Michael Carter
(74) *Attorney, Agent, or Firm* — Sughrue Mion, PLLC

(57) ABSTRACT

A DC-coupled laser drive circuit (1) includes (i) a voltage drop section (14) provided between a power source and a pre-driver (12) and (ii) a voltage drop amount controlling section (16) for controlling, according to an output of the pre-driver (12), an amount of a voltage drop in the voltage drop section (14).

10 Claims, 8 Drawing Sheets

(56) References Cited

OTHER PUBLICATIONS

Japanese Office Action for JP 2012-013544 dated Mar. 5, 2013.
Japanese Office Action for JP 2012-013544 dated Dec. 4, 2012.
Communication dated Aug. 6, 2014, issued by the Taiwan Patent Office in corresponding Taiwanese Application No. 101137674.
Communication dated Oct. 20, 2014 from the State Intellectual Property Office of People's Republic of China in counterpart application No. 201280003107.0.

* cited by examiner

DC-COUPLED LASER DRIVE CIRCUIT AND METHOD FOR DRIVING LASER DIODE DEVICE

CROSS-REFERENCE TO RELATED APPLICATIONS

This application is a Continuation of PCT International Application No. PCT/JP2012/074439 filed in Japan on Sep. 24, 2012, which claims the benefit of Patent Application No. 2012-013544 filed in Japan on Jan. 25, 2012, the entire contents of which are hereby incorporated by reference.

TECHNICAL FIELD

The present invention relates to (i) a DC-coupled laser drive circuit for driving a laser diode device and (ii) a method for driving a laser diode device with the use of a DC-coupled laser drive circuit.

BACKGROUND ART

Laser diode devices have been widely used as light sources that emit signal light for optical communications. Laser diode devices are generally driven by laser drive circuits that also supply driving currents to the laser diode devices. Such laser drive circuits are roughly classified into two types: DC-coupled laser drive circuits and AC-coupled laser drive circuits.

A typical structure of a conventional DC-coupled laser drive circuit is illustrated in (a) of FIG. 7. (a) of FIG. 7 is a block diagram schematically illustrating a structure of a conventional DC-coupled laser drive circuit 100.

The DC-coupled laser drive circuit 100 is a circuit for supplying, to a laser diode device LD, a driving current ILD which varies depending on a voltage (electrical potential difference) of an input signal (a voltage signal that has been modulated by a data signal). As illustrated in (a) of FIG. 7, the DC-coupled laser drive circuit 100 includes an input buffer 110, a pre-driver 120, a main driver 130, a voltage drop section 140, and a constant electric current source 150.

The input buffer 110 is a circuit for matching between (i) input impedance (load impedance) in the DC-coupled laser drive circuit 100 and (ii) characteristic impedance of a transmission line. The pre-driver 120 is a circuit for adjusting an amplitude of an input signal supplied via the input buffer 110. The main driver 130 is a circuit for converting, into an electric current signal, the input signal whose amplitude has been adjusted by the pre-driver 120. The voltage drop section 140 is a voltage drop device such as a fixed resistance or a diode, and is provided between power source voltage VCC and the pre-driver 120.

The main driver 130 is connected to the laser diode device LD and the constant electric current source 150. The laser diode device LD receives the driving current ILD which is equal to a subtraction of Imod from Idc (ILD=Idc−Imod), where (i) the Imod indicates an inflow electric current flowing into the main driver 130 and (ii) the Idc indicates an outflow electric current flowing out of the constant electric current source 150. In a case where a voltage of the input signal is low, an electric current of the inflow electric current Imod becomes high, and consequently an electric current of the driving current ILD becomes low. In contrast, in a case where a voltage of the input signal is high, an electric current of the inflow electric current Imod becomes low, and consequently an electric current of the driving current ILD becomes high.

Note that the outflow electric current Idc flowing out of the constant electric current source 150 is controlled such that an electric current of bias electric current Ibias is greater than that of threshold laser electric current Ith. Note that the bias electric current Ibias herein refers to an electric current of the driving current ILD while a low voltage is being supplied to the laser diode device LD as the input signal.

A typical structure of a conventional AC-coupled laser drive circuit is illustrated in (b) of FIG. 7. (b) of FIG. 7 is a block diagram schematically illustrating a structure of a conventional AC-coupled laser drive circuit 200.

As is the DC-coupled laser drive circuit 100, the AC-coupled laser drive circuit 200 is a circuit for supplying, to a laser diode device LD, driving current ILD which varies depending on a voltage of an input signal. As illustrated in (b) of FIG. 7, the AC-coupled laser drive circuit 200 includes an input buffer 210, a pre-driver 220, a main driver 230, a voltage drop section 240, and a constant electric current source 250.

Functions of the input buffer 210, the pre-driver 220, the main driver 230, the voltage drop section 240, and the constant electric current source 250 illustrated in (b) of FIG. 7, are similar to those of the input buffer 110, the pre-driver 120, the main driver 130, the voltage drop section 140, and the constant electric current source 150 illustrated in (a) of FIG. 7, respectively.

The AC-coupled laser drive circuit 200 differs from the DC-coupled laser drive circuit 100 in that a capacitor 260 is interposed between the main driver 230 and the laser diode device LD. This prevents, even in a case where the main driver 230 of the AC-coupled laser drive circuit 200 outputs output voltage Vout involving a DC component, the DC component from being supplied to the laser diode device.

Compared with the AC-coupled laser drive circuit 200, the DC-coupled laser drive circuit 100 has the following advantages:

1) With the AC-coupled laser drive circuit 200, it is necessary to use, as a capacitor 260, a large capacitor having a capacitance of approximately 0.1 μF. This hinders the AC-coupled laser drive circuit 200 from being space-saving. On the other hand, the DC-coupled laser drive circuit 100 does not require such a large capacitor, and can therefore save space without difficulty.

2) According to the AC-coupled laser drive circuit 200, the capacitor 260 blocks low-frequency components of the driving current ILD. This hinders the AC-coupled laser drive circuit 200 from becoming broadband compatible. On the other hand, the DC-coupled laser drive circuit 100 does not require such a capacitor, and can therefore become broadband compatible without difficulty.

3) With the AC-coupled laser drive circuit 200, it is necessary to suppress output impedance of the main driver 230 low, and therefore loss of the driver electric current ILD can easily become significant. This hinders the AC-coupled laser drive circuit 200 from becoming power saving. With the DC-coupled laser drive circuit 100, on the other hand, there is no necessity to suppress output impedance of the main driver 130 low, and it is therefore easy to save electric power.

For example, a laser drive circuit to be mounted on an AOC (Active Optical Cable), which laser drive circuit is required to be space-saving, is preferably a DC-coupled laser drive circuit. As another example, a laser drive circuit for generating a burst signal in a network such as a PON (Passive Optical Network) must be a DC-coupled laser drive circuit having no concern of blocking low-frequency components.

Patent Literature 1 is mentioned below as an example of literatures disclosing DC-coupled laser drive circuits.

CITATION LIST

Patent Literature

Patent Literature 1
Japanese Patent Application Publication, Tokukai, No. 2010-267799 A (Publication Date: Nov. 25, 2010)

SUMMARY OF INVENTION

Technical Problem

The conventional DC-coupled laser drive circuit 100 illustrated in (a) of FIG. 7 has had a problem that the pre-driver 120 is subject to tight restrictions in order that operating conditions of elements, of which the main driver 130 is made, are met.

The problem will be described below in a little more detail with reference to FIG. 8. FIG. 8 is a circuit diagram illustrating a specific example of the DC-coupled laser drive circuit 100 illustrated in (a) of FIG. 7.

The input buffer 110 includes a pair of terminating resistors. One of the terminating resistors is configured such that one end is connected to a power source of voltage Vt whereas the other end is connected to an input terminal DATA_P. The other one of the terminating resistors is configured such that one end is connected to a power source of voltage Vt whereas the other end is connected to an input terminal DATA_N. In a case where, for example, transmission lines each have characteristic impedance of 50Ω, fixed resistors each having a resistance of 50Ω are used as the terminating resistors. This matches between (i) input impedance (load impedance) of the DC-coupled laser drive circuit 100 and (ii) the characteristic impedance of the transmission lines.

The pre-driver 120 is made up of a differential amplifying circuit 120a and an emitter follower circuit 120b. While the differential amplifier circuit 120a is provided for carrying out differential amplification with respect to two input signals, the emitter follower circuit 120b is provided for lowering output impedance of the pre-driver 120 so as to be lower than input impedance of the main driver 130.

The differential amplifying circuit 120a includes (i) a pair of resistors R1 and R2, (ii) a pair of transistors Q1 and Q2, and (iii) a constant electric current source I1. The differential amplifying circuit 120a converts amplitudes of input signals into respective specified amplitudes represented as R1×I1 (equal to R2×I1) and then outputs the amplified signal. One end of the resistor R1 is connected to the resistor R2, and the other end of the resistor R1 is connected to a collector terminal of the transistor Q1. Likewise, one end of the resistor R2 is connected to the resistor R1, and the other end of the resistor R2 is connected to a collector terminal of the transistor Q2. A node between the resistor R1 and the resistor R2 is connected, via the voltage drop section 140, to the power source of the voltage VCC. Where an amount of a voltage drop in the voltage drop section 140 is represented as V, voltage Vdc (=VCC−V) is applied to the node. While a base terminal of the transistor Q1 is connected to the input terminal DATA_P, an emitter terminal of the transistor Q1 is connected to an emitter terminal of the transistor Q2. Likewise, while a base terminal of the transistor Q2 is connected to the input terminal DATA_N, the emitter terminal of the transistor Q2 is connected to the emitter terminal of the transistor Q1. A node between the emitter terminals of the respective transistors Q1 and Q2 is connected, via the constant electric current source I1, to ground having voltage VEE.

The emitter follower circuit 120b includes a pair of transistors Q3 and Q4 and a pair of constant electric current sources I2 and I3. The transistor Q3 has (i) a collector terminal which is connected to the power source of the voltage VCC, (ii) a base terminal which is connected to one (the collector terminal of the transistor Q2) of output nodes of the differential amplifying circuit 120a, and (iii) an emitter terminal which is connected, via the constant electric current source I2, to ground having the voltage VEE. Likewise, the transistor Q4 has (i) a collector terminal which is connected to the power source of the voltage VCC, (ii) a base terminal which is connected to the other one (the collector terminal of the transistor Q1) of the output nodes of the differential amplifying circuit 120a, and (iii) an emitter terminal which is connected, via the constant electric current source I3, to ground having the voltage VEE.

The main driver 130 includes (a) a pair of transistors Q5 and Q6 and (b) a constant electric current source I4. The transistor Q5 has (i) a collector terminal which is connected, via the constant electric current source 150, to the power source of the voltage VCC, (ii) a base terminal which is connected to one (the emitter terminal of the transistor Q4) of output points of the pre-driver 120, and (iii) an emitter terminal which is connected to an emitter terminal of the transistor Q6. Likewise, the transistor Q6 has (i) a collector terminal which is connected to the power source of the voltage VCC, (ii) a base terminal which is connected to the other one (the emitter terminal of the transistor Q3) of the output points of the pre-driver 120, and (iii) the emitter terminal which is connected to the emitter terminal of the transistor Q5. A node between the emitter terminals of the respective transistors Q5 and Q6 is connected, via the constant electric current source I4, to ground having the voltage VEE.

An output terminal OUT of the DC-coupled laser drive circuit 100 is provided between the constant electric current source 150 and an output point (the collector terminal of the transistor Q5) of the main driver 130. Therefore, driving current ILD, which is supplied from the output terminal OUT to the laser diode LD, is equal to a subtraction of Imod from Idc (Idc−Imod), where (i) the Idc is an outflow electric current flowing out of the constant electric current source 150 and (ii) the Imod is an inflow electric current flowing into the transistor Q5.

With the DC-coupled laser drive circuit 100 thus configured, it is extremely difficult to meet respective operating conditions of the transistor Q5 and of the constant electric current source I4 simultaneously. Note that the operating condition of the transistor Q5 requires that, in the transistor Q5, a voltage at the base terminal be not more than a voltage at the collector terminal. Also note that the operating condition of the constant electric current source I4 requires that a voltage applied across the constant electric current source I4 be not less than 0.5 V. Without meeting the respective operating conditions, it is impossible to properly operate the transistor Q5 and the constant electric current source I4.

The following description will explain how these operating conditions cannot be met simultaneously, with the use of an example in which (i) a bias voltage across the laser diode device LD is set to fluctuate in a range of not less than 1.5 V to not more than 2.5 V (2.0 V±25%) and (ii) the power source voltage VCC is set to fluctuate in a range of not less than 2.97 V to not more than 3.63 V (3.3±10%).

In order to meet the operating condition of the transistor Q5, it is necessary to set an amount V of a voltage drop in the voltage drop section 140 to 1.13 V or more. This is because, in a case where the power source voltage VCC and bias voltage Vout across the laser diode device LD are 3.63 V and 1.5 V respectively, (i) a voltage across the base terminal of the transistor Q5 is determined by [3.63 V (power source voltage)−V (amount of a voltage drop in voltage drop section 140)−0.2 V (amount of a voltage drop at resistor R1)−0.8 V (voltage between base terminal and emitter terminal of transistor Q4)] and (ii) a voltage at the collector terminal of the transistor Q5 becomes equal to 1.5 V (bias voltage across laser diode device LD). In fact, solution of an inequality [3.63−V−0.2−0.8≦1.5] leads to an inequality [V≧1.13].

However, in a case where the amount V of a voltage drop is set to 1.13 V or more, the operating condition of the constant electrical current source I4 cannot be met when, for example, the power source voltage VCC is 2.97 V. This is because, in such a case, a voltage to be applied across the constant electrical current source I4 (i.e. voltage Ve between respective emitter terminals of transistors Q5 and Q6) becomes lower than 0.04 V which is derived from [2.97 V (power source voltage)−1.13 V (minimum amount of a voltage drop in voltage drop section 140)−0.2 V (amount of a voltage drop at resistors R1 and R2)−0.8 V (base terminal-emitter terminal voltage at transistors Q4 and Q3)−0.8 V (base terminal-emitter terminal voltage at transistors Q5 and Q6)]. In a case where the voltage Ve is 0.5 V or less, the operating condition of the constant electric current source I4 cannot be met, and therefore the constant electric current source I4 cannot properly operate, as described earlier.

In a case where the power source voltage VCC is thus set to fluctuate in a range of not less than 2.97 V to not more than 3.63 V, the operating conditions of the transistors Q5 and of the constant electric current source I4 cannot be met simultaneously. In other words, the power source voltage VCC needs to be set to fluctuate in a more restricted range in order for the operating conditions to be met simultaneously.

Note that the voltage drop section 140 of the conventional DC-coupled laser drive circuit 100 is made up of a fixed resistor(s) and/or a diode(s), and that the amount of a voltage drop in the voltage drop section 140 is constant.

The present invention has been made in view of the problem, and it is an object of the present invention to realize a DC-coupled laser drive circuit which, in order to simultaneously meet operating conditions of respective elements constituting a main driver, is free of tight restrictions on a power source voltage of a pre-driver.

Solution to Problem

In order to attain the object, a DC-coupled laser drive circuit in accordance with the present invention includes: a pre-driver for adjusting an amplitude of a voltage signal modulated by a data signal; a main driver, connected to a laser diode device without a capacitor in between, which converts, into an electric current signal to be supplied to the laser diode device, a voltage signal whose amplitude has been adjusted by the pre-driver; a voltage drop section, provided between the pre-driver and a power source for supplying electric power to the pre-driver, in which an amount of a voltage drop is variable; and a voltage drop amount controlling section for controlling, in accordance with a voltage signal whose amplitude has been adjusted by the pre-driver, the amount of the voltage drop in the voltage drop section.

In order to attain the object, a method in accordance with the present invention for driving a laser diode includes the steps of: (i) adjusting, with the use of a pre-driver, an amplitude of a voltage signal modulated by a data signal; (ii) converting, by use of a main driver which is connected to a laser diode device without a capacitor in between, the voltage signal, whose amplitude has been adjusted in the step (i), into an electric current signal to be supplied to the laser diode; and (iii) controlling, in accordance with a voltage signal whose amplitude has been adjusted in the step (i), an amount of a voltage drop in a voltage drop section which is provided between the pre-driver and a power source for supplying electric power to the pre-driver.

According to the configuration, the amount of a voltage drop in the voltage drop section is adjusted in accordance with a voltage signal whose amplitude has been modulated by the pre-driver. Therefore, it is possible to reduce the amount of the voltage drop in accordance with such an output voltage (a value of a voltage signal whose amplitude has been adjusted by the pre-driver), in a case where the output voltage is excessively low due to a reduction in a voltage of the power source. In contrast, it is possible to increase the amount of the voltage drop in accordance with such an output voltage in a case where the output voltage is excessively high due to an increase in the voltage of the power source.

Hence, it is made possible to avoid the problem with a conventional DC-coupled laser drive circuit, that is, the problem of inability to meet the operating condition of a certain element (such as a constant electric current source) while a power source voltage of a pre-driver is being at a minimum. This was caused by the fact that a voltage-drop amount was set so as to meet the operating condition of another certain element (such as a transistor) while the power source voltage is being at a maximum.

Therefore, it is possible to realize (i) a DC-coupled laser drive circuit in which a power source voltage of a pre-driver need not be subject to tight restrictions and (ii) a method for driving a laser diode device, which method makes it unnecessary for a power source of a pre-driver to be subject to tight restrictions.

Advantageous Effects of Invention

With the present invention, it is possible to realize (i) a DC-coupled laser drive circuit in which a power source voltage of a pre-driver need not be subject to tight restrictions and (ii) a method for driving a laser diode device, which method makes it unnecessary for a power source of a pre-driver to be subject to tight restrictions.

DESCRIPTION OF EMBODIMENTS

Embodiment 1

Figure 1:
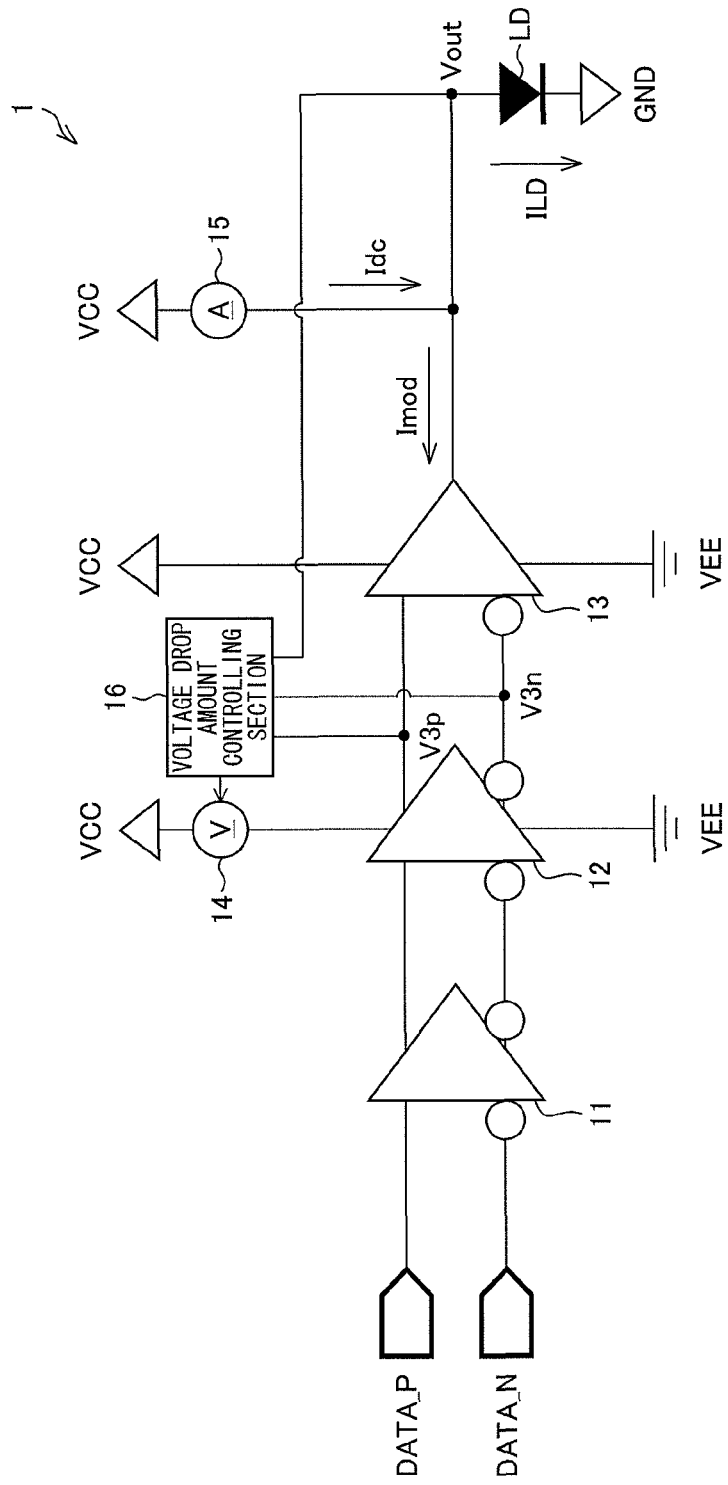
FIG. 1 is a block diagram schematically illustrating a configuration of a DC-coupled laser drive circuit in accordance with Embodiment 1 of the present invention.

Embodiment 1 of a DC-coupled laser drive circuit in accordance with the present invention will be described below with reference to FIG. 1. FIG. 1 is a block diagram schematically illustrating a DC-coupled laser drive circuit 1 of Embodiment 1.

The DC-coupled laser drive circuit 1 is a circuit for supplying, to a laser diode device LD, driving current ILD which varies depending on a voltage (electric potential difference) of an input signal (a voltage signal modulated by a data signal). As illustrated in FIG. 1, the DC-coupled laser drive circuit 1 includes an input buffer 11, a pre-driver 12, a main driver 13, a voltage drop section 14, a constant electric current source 15, and a voltage drop amount controlling section 16.

The input buffer 11 is a circuit for matching between (i) input impedance (load impedance) in the DC-coupled laser drive circuit 1 and (ii) characteristic impedance of a transmission line. The pre-driver 12 is a circuit for adjusting an amplitude of an input signal supplied via the input buffer 11. Note that "adjusting an amplitude of an input signal (voltage signal)" means that the amplitude of the input signal is equal to a specified amplitude. The main driver 13 is a circuit for converting, into an electric current signal, the input signal whose amplitude has been adjusted by the pre-driver 12. An amount of a voltage drop is variable in the voltage drop section 14. The voltage drop section 14 is provided between power source voltage VCC and the pre-driver 12.

The main driver 13 is connected to the constant electric current source 15 and the laser diode device LD. Embodiment 1 employs a circuit configuration in which (i) a cathode terminal of the laser diode device LD is grounded and (ii) an anode terminal of the laser diode device LD is connected to an output terminal of the main driver 13. Note, however, that the present invention is not limited to such a configuration. For example, the cathode terminal and the anode terminal of the laser diode device LD can be connected to the main driver 13 and a constant voltage source, respectively.

The laser diode device LD receives the driving current ILD which is equal to a subtraction of Imod from Idc (ILD=Idc−Imod), where (i) the Imod indicates an inflow electric current flowing into the main driver 13 and (ii) the Idc indicates an outflow electric current flowing out of the constant electric current source 15. In a case where a voltage of the input signal is low, an electric current of the inflow electric current Imod becomes high, and consequently an electric current of the driving current ILD becomes low. In contrast, in a case where a voltage of the input signal is high, an electric current of the inflow electric current Imod becomes low, and consequently an electric current of the driving current ILD becomes high.

Note that the outflow electric current Idc flowing out of the constant electric current source 15 is controlled such that an electric current of bias electric current Ibias is greater than that of threshold laser electric current Ith. Note that the bias electric current Ibias herein refers to an electric current of the driving current ILD while a low voltage is being supplied to the laser diode device LD as the input signal.

A feature configuration of the DC-coupled laser drive circuit 1 resides in the voltage drop amount controlling section 16. The voltage drop amount controlling section 16 is a circuit for controlling, in accordance with output voltages V3$p$ and V3$n$ of the pre-driver 12, an amount V of a voltage drop (hereinafter, referred to as a voltage-drop amount V) in the voltage drop section 14. Embodiment 1 employs a circuit configuration in which the voltage-drop amount V is controlled such that an average voltage of the output voltages V3$p$ and V3$n$ of the pre-driver 12 (i.e., (V3$p$+V3$n$)/2) is not more than bias voltage Vout across the laser diode device LD.

With such a circuit configuration, it is possible to reduce the voltage-drop amount V in accordance with such a mean value, in a case where a mean value of the output voltages V3$p$ and V3$n$ (=(V3$p$+V3$n$)/2) is excessively low due to a reduction in the power voltage VCC. In contrast, it is possible to increase the voltage-drop amount V in accordance with the mean value in a case where the mean value of the output voltages V3$p$ and V3$n$ (=(V3$p$+V3$n$)/2) is excessively high due to an increase in the power voltage VCC.

Hence, it is made possible to avoid the problem with the conventional DC-coupled laser drive circuit 100 (see FIG. 8), that is, the problem of inability to meet the operating condition of the constant electric current source 14 while the power source voltage VCC is being at a minimum. This was caused by the fact that the voltage-drop amount V was set so as to meet the operating condition of the transistor Q5 while the power source voltage VCC is being at a maximum.

Figure 8:
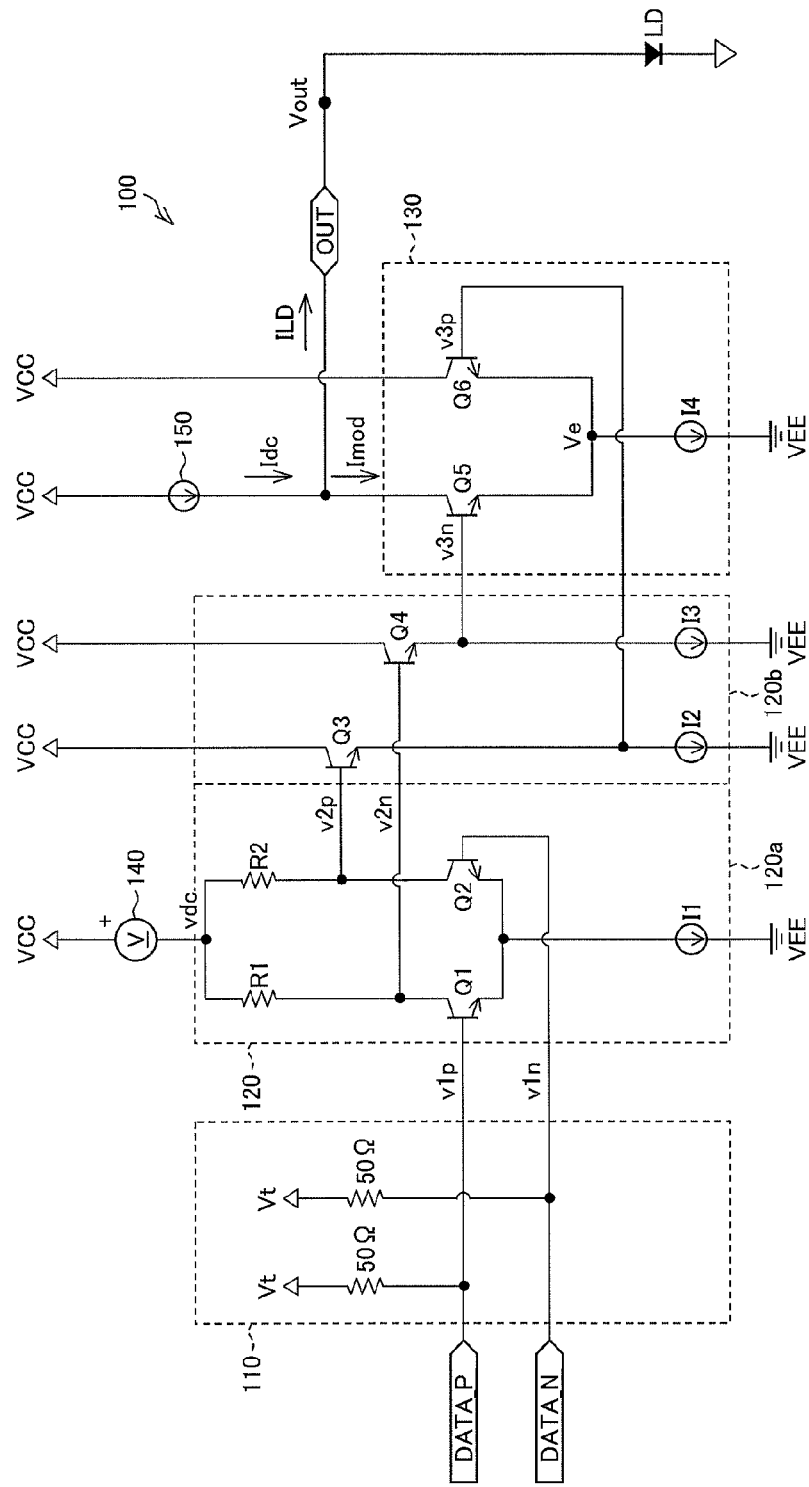
FIG. 8 is a circuit diagram illustrating a specific example of the conventional DC-coupled laser drive circuit illustrated in (a) of FIG. 7.

For example, according to the conventional DC-coupled laser drive circuit 100 illustrated in FIG. 8, the voltage-drop amount V needs to be set to approximately 1.3 V in a case where V3$n$ is intended to be 1.5 V in order for the laser diode device LD, to which bias voltage Vout of 1.5 V is applied, to be driven under a condition in which the power source voltage VCC is 3.6 V. However, in a case where the power source voltage VCC drops to 3.0 V while the voltage-drop amount V is being set to 1.3 V, a voltage to be applied across the constant electric current source I4 becomes approximately 0.1 V. This prevents the constant electric current source I4 from operating properly.

On the other hand, according to the DC-coupled laser drive circuit 1 illustrated in FIG. 1, (i) while the power source voltage VCC is being 3.6 V, the voltage-drop amount V is controlled to be 1.3 V so that V3$p$ becomes equal to the bias voltage Vout of 1.5 V and (ii) in a case where the power source voltage VCC drops to 3.0 V, the voltage-drop amount V is controlled to be 0.7 V so that V3$p$ becomes equal to the bias voltage Vout of 1.5 V. V3$p$ can be thus maintained at a desirable voltage by altering, in response to the output voltages V3$p$ and V3$n$ of the pre-driver 12, the voltage-drop amount V in the voltage drop section 14.

Specific Example 1

Figure 2:
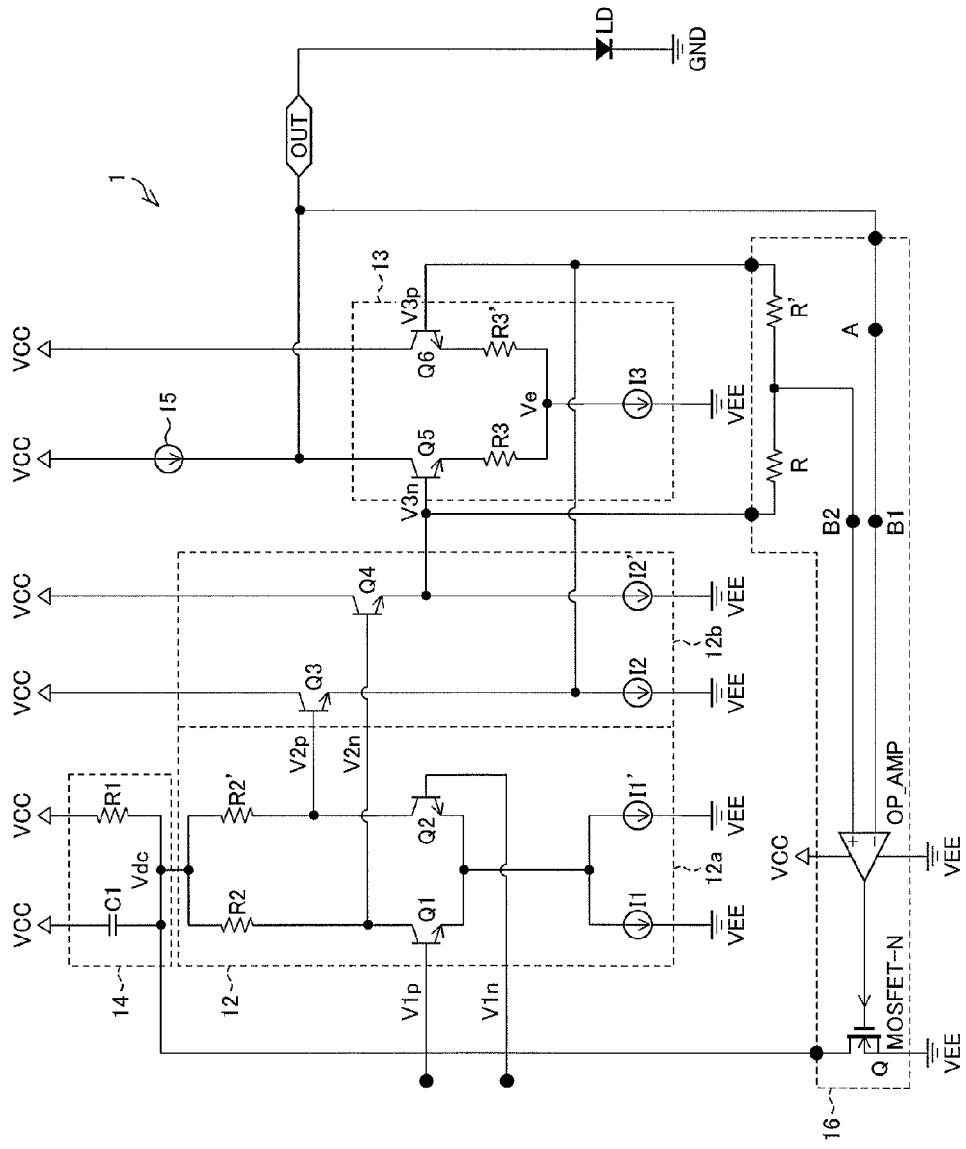
FIG. 2 is a circuit diagram illustrating Specific Example 1 of the DC-coupled laser drive circuit illustrated in FIG. 1.

A more specific configuration of the DC-coupled laser drive circuit 1 in accordance with Embodiment 1 will be described below with reference to FIG. 2. FIG. 2 is a circuit diagram illustrating Specific Example 1 of the DC-coupled laser drive circuit 1. Note that the input buffer 11 can be configured as in the case of the input buffer 110 of the conventional DC-coupled laser drive circuit 100, and therefore will not be illustrated in FIG. 2.

The pre-driver 12 is made up of a differential amplifying circuit 12$a$ and an emitter follower circuit 12$b$. The differential amplifying circuit 12$a$ is provided for carrying out differential amplification with respect to two input signals. The emitter follower circuit 12$b$ is provided for lowering output impedance of the pre-driver 12 so as to be lower than input impedance of the main driver 13. Note that gain of the differential amplifying circuit 12$a$ is set so that output signals have amplitudes which become equal to respective specified ones (which can be set to specified ones of not higher than or not lower than 0 dB).

The differential amplifying circuit 12a includes a pair of resistors R2 and R2', a pair of transistors Q1 and Q2, and a pair of constant electric current sources I1 and I1'. The differential amplifying circuit 12a converts amplitudes of input signals into respective specified amplitudes represented as R2×(I1+I1')=R2'×(I1+I1'), and then outputs amplified signals as respective output signals. One end of the resistor R2 is connected to the resistor R2', and the other end of the resistor R2 is connected to a collector terminal of the transistor Q1. Likewise, one end of the resistor R2' is connected to the resistor R2, and the other end of the resistor R2' is connected to a collector terminal of the transistor Q2. A node between the resistors R2 and R2' is connected, via the voltage drop section 14, to the power source of voltage VCC. Where an amount of a voltage drop in the voltage drop section 14 is represented as V, voltage Vdc (=VCC−V) is applied at the node. The transistor Q1 has (i) a base terminal which is connected to an input terminal DATA_P and (ii) an emitter terminal which is connected to an emitter terminal of the transistor Q2. Likewise, the transistor Q2 has (i) a base terminal which is connected to an input terminal DATA_N and (ii) the emitter terminal which is connected to the emitter terminal of the transistor Q1. A node between the emitter terminals of the respective transistors Q1 and Q2 is connected, via the constant electric current sources I1 and I1' which are connected to each other in parallel, to ground having voltage VEE.

The emitter follower circuit 12b includes a pair of transistors Q3 and Q4 and a pair of constant electric current sources I2 and I2'. The transistor Q3 has (i) a collector terminal which is connected to the power source of the voltage VCC, (ii) a base terminal which is connected to one (the collector terminal of the transistor Q2) of output nodes of the differential amplifying circuit 12a, and (iii) an emitter terminal which is connected, via the constant electric current source I2, to ground having the voltage VEE. Likewise, the transistor Q4 has (i) a collector terminal which is connected to the power source of the voltage VCC, (ii) a base terminal which is connected to the other one (the collector terminal of the transistor Q1) of the output nodes of the differential amplifying circuit 12a, and (iii) an emitter terminal which is connected, via the constant electric current source I2', to ground having the voltage VEE.

The main driver 13 includes (a) a pair of transistors Q5 and Q6, (b) a pair of resistors R3 and R3', and (c) a constant electric current source I3. The transistor Q5 has (i) a collector terminal which is connected, via the constant electric current source I5, to the power source of the voltage VCC, (ii) a base terminal which is connected to one (the emitter terminal of the transistor Q4) of output nodes of the pre-driver 12, and (iii) an emitter terminal which is connected, via transistors R3 and R3', to an emitter terminal of the transistor Q6. Likewise, the transistor Q6 has (i) a collector terminal which is connected to the power source of the voltage VCC, (ii) a base terminal which is connected to the other one (the emitter terminal of the transistor Q3) of the output nodes of the pre-driver 12, and (iii) the emitter terminal which is connected, via the transistors R3 and R3', to the emitter terminal of the transistor Q5. A node between the resistors R3 and R3' is connected, via the constant electric current source I3, to ground having the voltage VEE.

An output terminal OUT of the DC-coupled laser drive circuit 1 is provided between the constant electric current source I5 and an output node (the collector terminal of the transistor Q5) of the main driver 13. Therefore, driving current ILD, which is supplied from the output terminal OUT to the laser diode LD, is equal to a subtraction of Imod from Idc (Idc−Imod), where (i) the Idc is an outflow electric current flowing out of the constant electric current source 15 and (ii) the Imod is an inflow electric current flowing into the transistor Q5.

The voltage drop section 14 is made up of a resistor R1 and a capacitor C1. The resistor R1 has (i) one end which is connected to the power source having the voltage VCC and (ii) the other end which is connected to the differential amplifying circuit 12a of the pre-driver 12. The examples of the resistor R1 encompass a fixed resistor having a resistance of 240Ω. The capacitor C1 is connected in parallel to the resistor R1. Note that the capacitor C1 is added to the voltage drop section 14 for reducing high-frequency noises generated by the power source voltage VCC and for stabilizing the voltage Vdc to be applied to the pre-driver 12.

The voltage drop amount controlling section 16 includes a pair of resistors R and R', an operational amplifier OP_AMP, and a field-effect transistor MOSFET-N. The resistors R and R' (i) have identical electrical resistances and (ii) allow for the average voltage ((V3p+V3n)/2) of the non-inverted voltage V3p and the inverted voltage V3n of the pre-driver 12. The average voltage ((V3p+V3n)/2) is supplied to a non-inverting terminal of the operational amplifier OP_AMP whereas the bias voltage Vout of the laser diode device LD is supplied to an inverting terminal of the operational amplifier OP_AMP. As is clear from its symbol, the field-effect transistor MOSFET-N is an n-type MOSFET. The field-effect transistor MOSFET-N has (i) a gate terminal which is connected to an output terminal of the operational amplifier OP_AMP, (ii) a drain terminal which is connected to a node between the voltage drop section 14 and the pre-driver 12, and (iii) a source terminal which is connected to ground having the voltage VEE.

In a case where the average voltage ((V3p+V3n)/2) becomes higher than the bias voltage Vout, the voltage drop amount controlling section 16 operates as follows. Specifically, a rise in output voltage of the operational amplifier OP_AMP causes (i) an increase in electric current flowing across the field-effect transistor MOSFET-N and (ii) an increase in electric current flowing across the resistor R1 (which constitutes the voltage drop section 14). The voltage-drop amount V across the resistor R1 becomes large, accordingly. Since this causes a reduction in the voltage Vdc (=VCC−V) which is applied to the pre-driver 12, output voltages V3p and V3n decrease. This operation sequence continues until the average voltage ((V3p+V3n)/2) becomes equal to the bias voltage Vout.

On the other hand, in a case where the average voltage ((V3p+V3n)/2) becomes lower than the bias voltage Vout, the voltage drop amount controlling section 16 operates as follows. Specifically, a reduction in output voltage of the operational amplifier OP_AMP causes (i) a decrease in electric current flowing across the field-effect transistor MOSFET-N and (ii) a decrease in electric current flowing across the resistor R1 (which constitutes the voltage drop section 14). The voltage-drop amount V across the resistor R1 becomes small, accordingly. Since this causes a rise in the voltage Vdc (=VCC−V) which is applied to the pre-driver 12, output voltages V3p and V3n increase. This operation sequence continues until the average voltage ((V3p+V3n)/2) becomes equal to the bias voltage Vout.

The voltage drop amount controlling section 16 thus controls the voltage-drop amount V in the voltage drop section 14 such that the average voltage ((V3p+V3n)/2) becomes equal to the bias voltage Vout.

Note that although, in Specific Example 1, a field-effect transistor is used as a transistor for constituting the voltage drop amount controlling section 16, examples of the transistor are not limited to such. That is, it is also possible to use, as the transistor, an npn-type bipolar transistor instead of an n-type MOSFET.

Also note that, although Specific Example 1 employs a configuration in which an average voltage ((V3p+V3n)/2) is directly applied to the operational amplifier OP_AMP, Example 1 is not limited to such. That is, it is also possible to employ another configuration in which an average voltage ((V3p+V3n)/2) is applied to the operational amplifier OP_AMP via a voltage drop section provided at a point A (see FIG. 2). In a case where (i) such another configuration is employed and (ii) an amount of a voltage drop in the voltage drop section is represented as ΔV (>0), the average voltage ((V3p+V3n)/2) can be made equal to (Vout−ΔV). This allows a voltage at the collector terminal of the transistor Q5 to remain lower than a voltage at the base terminal of the transistor Q5 (which is equal to the bias voltage Vout of the laser diode device LD). As such, it is possible for the transistor Q5 to operate more stably. The same principle applies to the transistor Q6 as well.

Also note that, although Specific Example 1 employs a configuration in which the bias voltage Vout and the average voltage ((V3p+V3n)/2) are directly applied to the operational amplifier OP_AMP, Specific Example 1 is not limited to such. That is, it is possible to employ another configuration in which (i) the bias voltage Vout is applied to the operational amplifier OP_AMP via a low-pass filter provided at a point B1 (see FIG. 2) and (ii) the average voltage ((V3p+V3n)/2) is applied to the operational amplifier OP_AMP via a low-pass filter provided at a point B2 (see FIG. 2). In a case where such another configuration is employed, even if the bias voltage Vout and the average voltage ((V3p+V3n)/2) fluctuate due to the modulation, resulting fluctuations in input voltages supplied to the operational amplifier OP_AMP, can be suppressed. This allows an output voltage of the operational amplifier OP_AMP to be stabilized.

Specific Example 2

Figure 3:
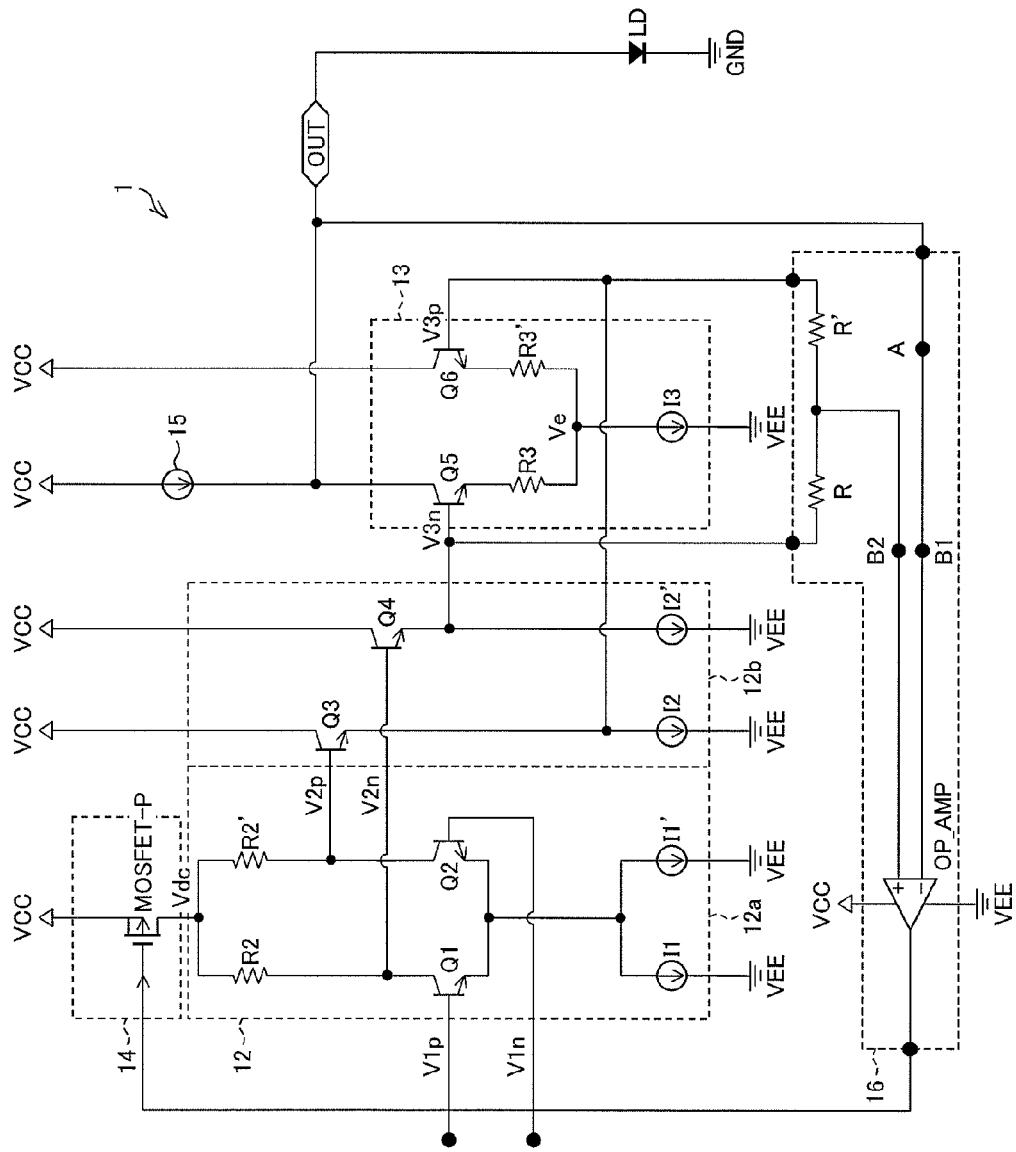
FIG. 3 is a circuit diagram illustrating Specific Example 2 of the DC-coupled laser drive circuit illustrated in FIG. 1.

A more specific circuit configuration of the DC-coupled laser drive circuit 1 in accordance with Embodiment 1 will be described below with reference to FIG. 3. FIG. 3 is a circuit diagram illustrating Specific Example 2 of the DC-coupled laser drive circuit 1. Note that an input buffer 11 can be configured as in the case of the input buffer 110 of the conventional DC-coupled laser drive circuit 100, and therefore will not be illustrated in FIG. 3.

Configurations of a pre-driver 12 and a main driver 13 in Specific Example 2 are similar to those of the pre-driver 12 and the main driver 13 in Specific Example 1. Specific Example 2 only differs from Specific Example 1 in circuit configurations of a voltage drop section 14 and a voltage drop amount controlling section 16.

The voltage drop section 14 is constituted by a field-effect transistor MOSFET-P. As is clear from its symbol, the field-effect transistor MOSFET-P is a p-type MOSFET. The field-effect transistor MOSFET-P has (i) a source terminal which is connected to a power source having voltage VCC and (ii) a drain terminal which is connected to a differential amplifying circuit 12a of the pre-driver 12. The field-effect transistor MOSFET-P has a resistance of a drain-to-source connection which varies, and therefore functions as a variable resistor.

The voltage drop amount controlling section 16 includes a pair of resistors R and R' and an operational amplifier OP_AMP. The resistors R and R' (i) have identical electrical resistances and (ii) allow for an average voltage ((V3p+V3n)/2) of a non-inverted output V3p and an inverted output V3n of the pre-driver 12. The average voltage ((V3p+V3n)/2) is supplied to a non-inverting input terminal of the operational amplifier OP_AMP whereas bias voltage Vout of a laser diode device LD is supplied to an inverting input terminal of the operational amplifier OP_AMP. An output terminal of the operational amplifier OP_AMP is connected to a gate terminal of the field-effect transistor MOSFET-P constituting the voltage drop section 14.

In a case where the average voltage ((V3p+V3n)/2) becomes higher than the bias voltage Vout, the voltage drop amount controlling section 16 operates as follows. Specifically, a rise in an output voltage of the operational amplifier OP_AMP causes (i) an increase in a voltage at the gate terminal of the field-effect transistor MOSFET-P and (ii) an increase in the resistance in the source-to-drain connection of the field-effect transistor MOSFET-P. The voltage-drop amount V across the field-effect transistor MOSFET-P becomes large, accordingly. Since this causes a reduction in the voltage Vdc (=VCC−V) which is applied to the pre-driver 12, output voltages V3p and V3n of the pre-driver 12 decrease. This operation sequence continues until the average voltage ((V3p+V3n)/2) becomes equal to the bias voltage Vout.

On the other hand, in a case where the average voltage ((V3p+V3n)/2) becomes lower than the bias voltage Vout, the voltage drop amount controlling section 16 operates as follows. Specifically, a reduction in an output voltage of the operational amplifier OP_AMP causes (i) an increase in a voltage at the gate terminal of the field-effect transistor MOSFET-P and (ii) a decrease in the resistance in the source-to-drain connection of the field-effect transistor MOSFET-P. The voltage-drop amount V across the field-effect transistor MOSFET-P becomes small, accordingly. Since this causes a rise in the voltage Vdc (=VCC−V) which is applied to the pre-driver 12, output voltages V3p and V3n of the pre-driver 12 increase. This operation sequence continues until the average voltage ((V3p+V3n)/2) becomes equal to the bias voltage Vout.

The voltage drop amount controlling section 16 thus controls the voltage-drop amount V in the voltage drop section 14 such that the average voltage ((V3p+V3n)/2) becomes equal to the bias voltage Vout.

Also note that Specific Example 2 employs a configuration in which an average voltage ((V3p+V3n)/2) is directly applied to the operational amplifier OP_AMP, it is possible to employ another configuration in which an average voltage ((V3p+V3n)/2) is applied to the operational amplifier OP_AMP via a voltage drop section provided at a point A (see FIG. 3). In a case where (i) such another configuration is employed and (ii) an amount of a voltage drop in the voltage drop section is represented as ΔV (>0), the average voltage ((V3p+V3n)/2) can be made equal to (Vout−ΔV). This allows a voltage at a collector terminal of a transistor Q5 to remain lower than a voltage at a base terminal of the transistor Q5 (which is equal to the bias voltage Vout of the laser diode device LD). As such, it is possible for the transistor Q5 to operate more stably. The same principle applies to the transistor Q6 as well.

It is also possible to employ another configuration in which (i) an average voltage ((V3p+V3n)/2) is applied to the operational amplifier OP_AMP via a low-pass filter provided at a point B1 (see FIG. 3) and (ii) the bias voltage Vout is applied to the operational amplifier OP_AMP via a low-pass filter provided at a point B2 (see FIG. 3). In a case where such another configuration is employed, even if the bias voltage Vout and the average voltage ((V3$p$+V3$n$)/2) fluctuate due to the modulation, resulting fluctuations in input voltages supplied to the operational amplifier OP_AMP, can be suppressed. This allows an output voltage of the operational amplifier OP_AMP to be stabilized.

Embodiment 2

Figure 4:
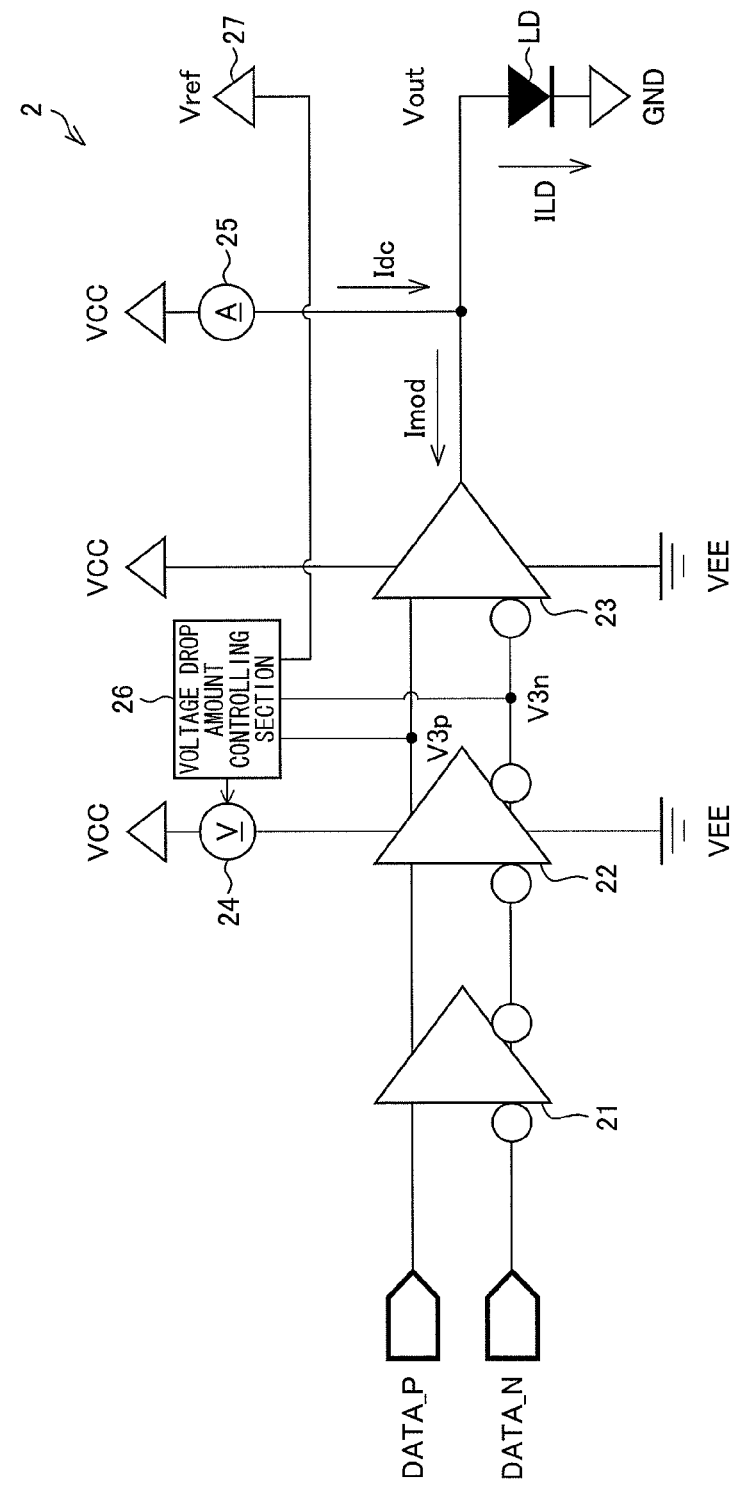
FIG. 4 is a block diagram schematically illustrating a DC-coupled laser drive circuit in accordance with Embodiment 2 of the present invention.

The following description will discuss, with reference to FIG. 4, Embodiment 2 of the DC-coupled laser drive circuit in accordance with the present invention. FIG. 4 is a block diagram schematically illustrating a configuration of a DC-coupled laser drive circuit 2 in accordance with Embodiment 2.

The DC-coupled laser drive circuit 2 is a circuit for supplying, to a laser diode device LD, driving current ILD which varies depending on a voltage (electric potential difference) of an input signal (a voltage signal modulated by a data signal). As illustrated in FIG. 4, the DC-coupled laser drive circuit 2 includes an input buffer 21, a pre-driver 22, a main driver 23, a voltage drop section 24, a constant electric current source 25, a voltage drop amount controlling section 26, and a constant voltage source 27.

The input buffer 21 is a circuit for matching between (i) input impedance (load impedance) of the DC-coupled laser drive circuit 2 and (ii) characteristic impedance of a transmission line. The pre-driver 22 is a circuit for adjusting amplitudes of input signals supplied via the input buffer 21. Note that "adjusting amplitudes of input signals (voltage signal)" means that the amplitude of the input signal is equal to a specified amplitude. The main driver 23 is a circuit for converting, into an electric current signal, the input signal whose amplitude has been adjusted by the pre-driver 22. An amount of a voltage drop is variable to in the voltage drop section 24. The voltage drop section 24 is provided between power source voltage VCC and the pre-driver 22.

The main driver 23 is connected to the constant electric current source 25 and the laser diode device LD. Note that although Embodiment 2 employs a configuration in which (i) a cathode terminal of the laser diode device LD is grounded and (ii) an anode terminal of the laser diode device LD is connected to the main driver 23, the present invention is not limited to such a configuration. For example, the anode terminal and the cathode terminal of the laser diode device LD can be connected to the constant voltage source and the main driver 23, respectively.

The laser diode device LD receives the driving current ILD which is equal to a subtraction of Imod from Idc (ILD=Idc−Imod), where (i) the Imod indicates an inflow electric current flowing into the main driver 23 and (ii) the Idc indicates an outflow electric current flowing out of the constant electric current source 25. In a case where a voltage of the input signal is low, an electric current of the inflow electric current Imod becomes high, and consequently an electric current of the driving current ILD becomes low. In contrast, in a case where a voltage of the input signal is high, an electric current of the inflow electric current Imod becomes low, and consequently an electric current of the driving current ILD becomes high.

Note that the outflow electric current Idc flowing out of the constant electric current source 25 is controlled such that an electric current of bias electric current Ibias is greater than that of threshold laser electric current Ith. Note that the bias electric current Ibias herein refers to an electric current of the driving current ILD while a low voltage is being supplied to the laser diode device LD as the input signal.

A feature configuration of the DC-coupled laser drive circuit 2 resides in the voltage drop amount controlling section 26. The voltage drop amount controlling section 26 is a circuit for controlling, in accordance with output voltages V3$p$ and V3$n$ of the pre-driver 22, an amount V of a voltage drop in the voltage drop section 24. Embodiment 2 employs a circuit configuration in which the voltage-drop amount V is controlled such that an average voltage of the output voltages V3$p$ and V3$n$ of the pre-driver 22 (i.e., (V3$p$+V3$n$)/2) is not more than predetermined reference voltage Vref. Therefore, the constant voltage source 27 for supplying the reference voltage Vref is connected to the voltage drop amount controlling section 26.

With such a circuit configuration, it is possible to reduce the voltage-drop amount V in accordance with such a mean value, in a case where a mean value of the output voltages V3$p$ and V3$n$ (=(V3$p$+V3$n$)/2) is excessively low due to a reduction in the power voltage VCC. In contrast, it is possible to increase the voltage-drop amount V in accordance with the mean value in a case where the mean value of the output voltages V3$p$ and V3$n$ (=(V3$p$+V3$n$)/2) is excessively high due to an increase in the power voltage VCC.

Hence, it is made possible to avoid the problem with the conventional DC-coupled laser drive circuit 100 (see FIG. 8), that is, the problem of inability to meet the operating condition of the constant electric current source I4 while the power source voltage VCC is being at a minimum. This was caused by the fact that the voltage-drop amount V was set so as to meet the operating condition of the transistor Q5 while the power source voltage VCC is being at a maximum.

Specific Example 1

Figure 5:
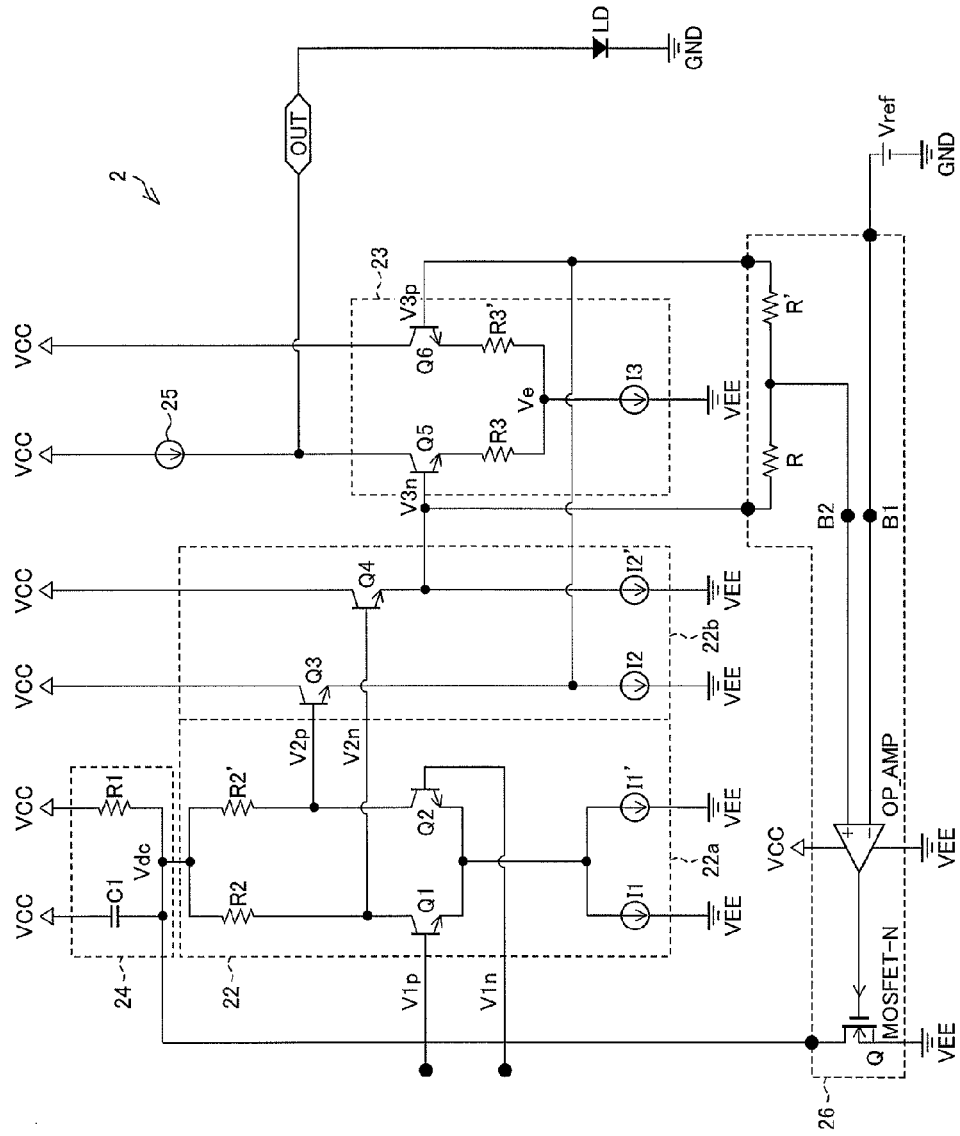
FIG. 5 is a circuit diagram illustrating Specific Example 1 of the DC-coupled laser drive circuit illustrated in FIG. 4.

A more specific configuration of the DC-coupled laser drive circuit 2 in accordance with Embodiment 2 will be described below with reference to FIG. 5. FIG. 5 is a circuit diagram illustrating a first specific example of the DC-coupled laser drive circuit 2. Note that the input buffer 21 can be configured as in the case of the input buffer 110 of the conventional DC-coupled laser drive circuit 100, and therefore will not be illustrated in FIG. 5.

Configurations of the pre-driver 22, the main driver 23, and the voltage drop section 24 of Specific Example 1 of Embodiment 2 are similar to those of the pre-driver 12, the main driver 13, and the voltage drop section 14 of Specific Example 1 of Embodiment 1. Specific Example 1 of Embodiment 2 differs from Specific Example 1 of Embodiment 2 in configuration of input of the voltage drop amount controlling section 26.

The voltage drop amount controlling section 26 includes a pair of resistors R and R', an operational amplifier OP_AMP, and a field-effect transistor MOSFET-N. The resistors R and R' (i) have identical electrical resistances and (ii) allow for the average voltage ((V3$p$+V3$n$)/2) of the non-inverted voltage V3$p$ and the inverted voltage V3$n$ of the pre-driver 22. The average voltage ((V3$p$+V3$n$)/2) is supplied to a non-inverting terminal of the operational amplifier OP_AMP whereas reference voltage Vref generated by the constant voltage source 27 is supplied to an inverting terminal of the operational amplifier OP_AMP. As is clear from its symbol, the field-effect transistor MOSFET-N is an n-type MOSFET. The field-effect transistor MOSFET-N has (i) a gate terminal which is connected to an output terminal of the operational amplifier OP_AMP, (ii) a drain terminal which is connected to a node between the voltage drop section 24 and the pre-driver 22, and (iii) a source terminal which is connected to ground having voltage VEE.

In a case where the average voltage $((V3p+V3n)/2)$ becomes higher than the reference voltage Vref, the voltage drop amount controlling section 26 operates as follows. Specifically, a rise in output voltage of the operational amplifier OP_AMP causes (i) an increase in electric current flowing across the field-effect transistor MOSFET-N and (ii) an increase in electric current flowing across the resistor R1 (which constitutes the voltage drop section 24). The voltage-drop amount V across the resistor R1 becomes large, accordingly. Since this causes a reduction in the voltage Vdc $(=VCC-V)$ which is applied to the pre-driver 22, output voltages V3p and V3n of the pre-driver 22 decrease. This operation sequence continues until the average voltage $((V3p+V3n)/2)$ becomes equal to the reference voltage Vref.

On the other hand, in a case where the average voltage $((V3p+V3n)/2)$ becomes lower than the reference voltage Vref, the voltage drop amount controlling section 26 operates as follows. Specifically, a reduction in output voltage of the operational amplifier OP_AMP causes (i) a decrease in electric current flowing across the field-effect transistor MOSFET-N and (ii) a decrease in electric current flowing across the resistor R1 (which constitutes the voltage drop section 24). The voltage-drop amount V across the resistor R1 becomes small, accordingly. Since this causes a rise in the voltage Vdc $(=VCC-V)$ which is applied to the pre-driver 22, output voltages V3p and V3n of the pre-driver 22 increase. This operation sequence continues until the average voltage $((V3p+V3n)/2)$ becomes equal to the reference voltage Vref.

The voltage drop amount controlling section 26 thus controls the voltage-drop amount V in the voltage drop section 24 such that the average voltage $((V3p+V3n)/2)$ becomes equal to the reference voltage Vref.

Also note that, although Specific Example 1 employs a configuration in which the reference voltage Vref and the average voltage $((V3p+V3n)/2)$ are directly applied to the operational amplifier OP_AMP, Specific Example 1 is not limited to such. That is, it is possible to employ another configuration in which (i) the reference voltage Vref is applied to the operational amplifier OP_AMP via a low-pass filter provided at a point B1 (see FIG. 5) and (ii) the average voltage $((V3p+V3n)/2)$ is applied to the operational amplifier OP_AMP via a low-pass filter provided at a point B2 (see FIG. 5). In a case where such another configuration is employed, even if a high-frequency noise exists in the reference voltage Vref and the average voltage $((V3p+V3n)/2)$ fluctuate due to the modulation, resulting fluctuations in input voltages supplied to the operational amplifier OP_AMP, can be suppressed. This allows an output voltage of the operational amplifier OP_AMP to be stabilized.

Specific Example 2

Figure 6:
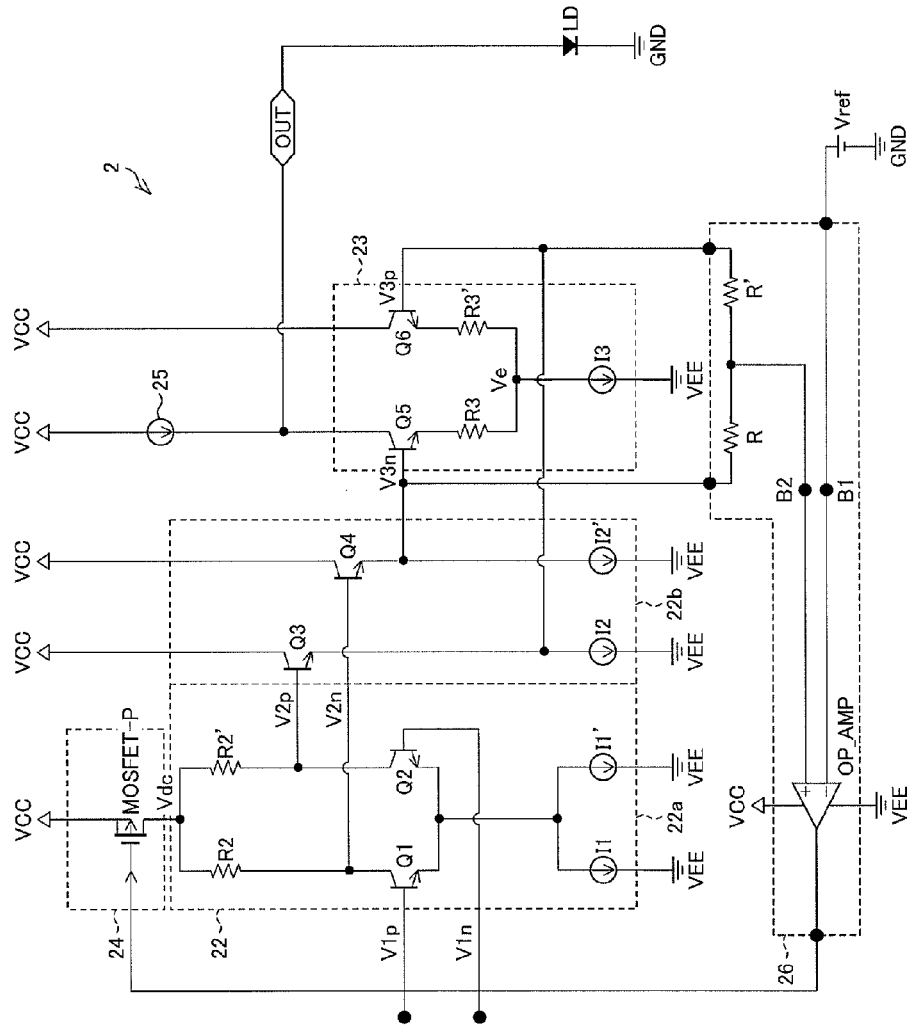
FIG. 6 is a circuit diagram illustrating Specific Example 2 of the DC-coupled laser drive circuit illustrated in FIG. 4.
Figure 7:
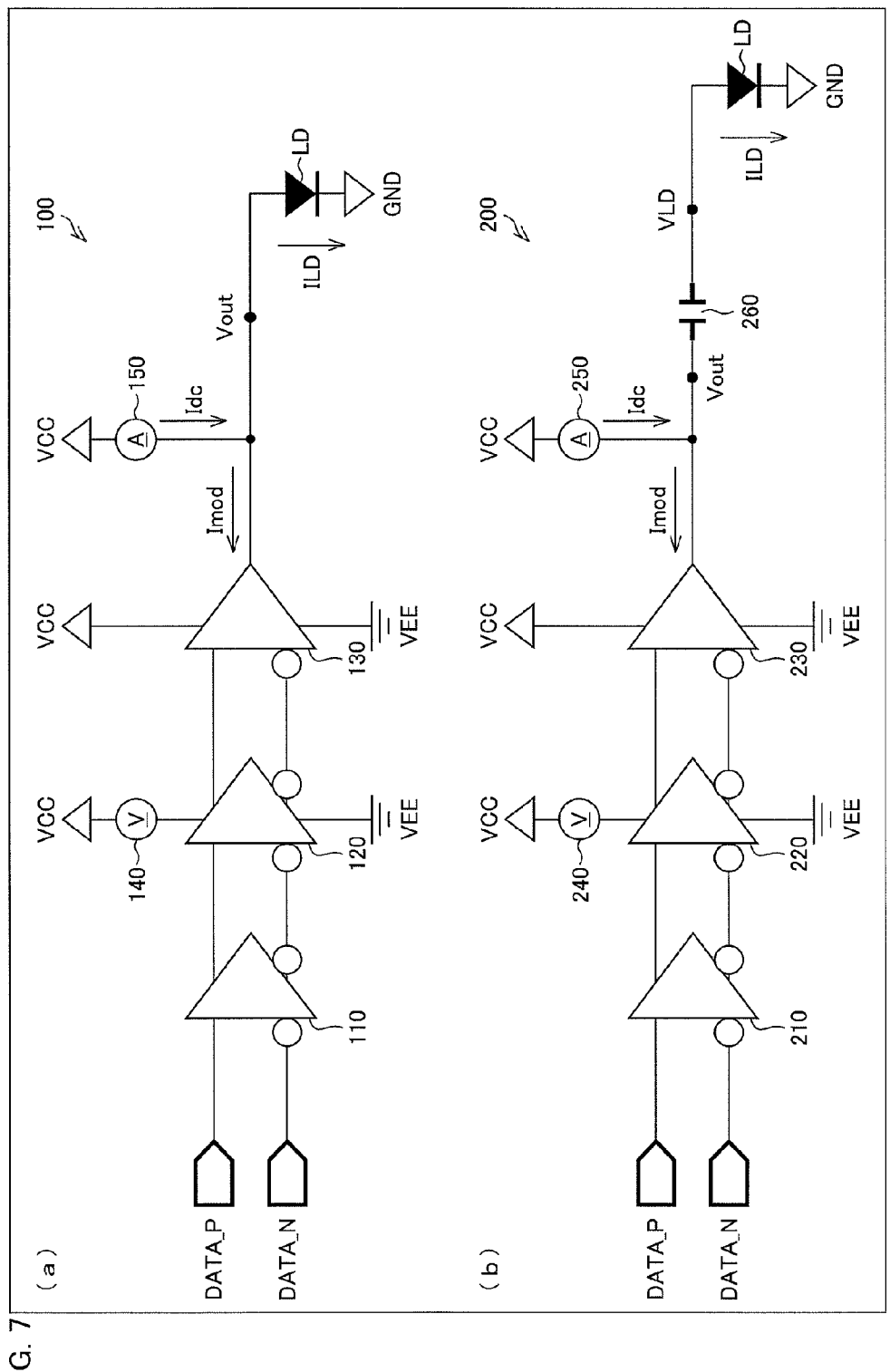
FIG. 7 is a set of block diagrams each schematically illustrating a configuration of a conventional laser drive circuit, (a) of FIG. 7 schematically illustrating a configuration of a conventional DC-coupled laser drive circuit and (b) of FIG. 7 schematically illustrating a configuration of a conventional AC-coupled laser drive circuit.

Another specific configuration of the DC-coupled laser drive circuit 2 in accordance with Embodiment 2 will be described below with reference to FIG. 6. FIG. 6 is a circuit diagram illustrating Specific Example 2 of the DC-coupled laser drive circuit 2. Note that the input buffer 21 can be configured as in the case of the input buffer 110 of the conventional DC-coupled laser drive circuit 100, and therefore will not be illustrated in FIG. 6.

Configurations of the pre-driver 22, the main driver 23, and the voltage drop section 24 of Specific Example 2 of Embodiment 2 are similar to those of the pre-driver 12, the main driver 13, and the voltage drop section 14 of Specific Example 2 of Embodiment 1. Specific Example 2 of Embodiment differs from Specific Example 2 of Embodiment 1 in configuration of input of the voltage drop amount controlling section 26.

The voltage drop amount controlling section 26 includes a pair of resistors R and R' and an operational amplifier OP_AMP. The resistors R and R' (i) have identical electrical resistances and (ii) allow for an average voltage $((V3p+V3n)/2)$ of a non-inverted output V3p and an inverted output V3n of the pre-driver 22. The average voltage $((V3p+V3n)/2)$ is supplied to a non-inverting input terminal of the operational amplifier OP_AMP whereas reference voltage Vref generated by the constant voltage source 27 is supplied to an inverting input terminal of the operational amplifier OP_AMP. An output terminal of the operational amplifier OP_AMP is connected to a gate terminal of the field-effect transistor MOSFET-P constituting the voltage drop section 24.

In a case where the average voltage $((V3p+V3n)/2)$ becomes higher than the reference voltage Vref, the voltage drop amount controlling section 26 operates as follows. Specifically, a rise in an output voltage of the operational amplifier OP_AMP causes (i) an increase in a voltage at the gate terminal of the field-effect transistor MOSFET-P and (ii) an increase in the resistance in the source-to-drain connection of the field-effect transistor MOSFET-P. The voltage-drop amount V across the field-effect transistor MOSFET-P becomes large, accordingly. Since this causes a reduction in the voltage Vdc $(=VCC-V)$ which is applied to the pre-driver 22, output voltages V3p and V3n of the pre-driver 22 decrease. This operation sequence continues until the average voltage $((V3p+V3n)/2)$ becomes equal to the reference voltage Vref.

On the other hand, in a case where the average voltage $((V3p+V3n)/2)$ becomes lower than the reference voltage Vref, the voltage drop amount controlling section 26 operates as follows. Specifically, a reduction in an output voltage of the operational amplifier OP_AMP causes (i) an increase in a voltage at the gate terminal of the field-effect transistor MOSFET-P and (ii) a decrease in the resistance in the source-to-drain connection of the field-effect transistor MOSFET-P. The voltage-drop amount V across the field-effect transistor MOSFET-P becomes small, accordingly. Since this causes a rise in the voltage Vdc $(=VCC-V)$ which is applied to the pre-driver 22, output voltages V3p and V3n of the pre-driver 22 increase. This operation sequence continues until the average voltage $((V3p+V3n)/2)$ becomes equal to the reference voltage Vref.

The voltage drop amount controlling section 26 thus controls the voltage-drop amount V in the voltage drop section 24 such that the average voltage $((V3p+V3n)/2)$ becomes equal to the reference voltage Vref.

Also note that, although Specific Example 1 employs a configuration in which the reference voltage Vref and the average voltage $((V3p+V3n)/2)$ are directly applied to the operational amplifier OP_AMP, Specific Example 1 is not limited to such. That is, it is possible to employ another configuration in which (i) the reference voltage Vref is applied to the operational amplifier OP_AMP via a low-pass filter provided at a point B1 (see FIG. 5) and (ii) the average voltage $((V3p+V3n)/2)$ is applied to the operational amplifier OP_AMP via a low-pass filter provided at a point B2 (see FIG. 5). In a case where such another configuration is employed, even if a high-frequency noise exists in the reference voltage Vref and the average voltage $((V3p+V3n)/2)$ fluctuate due to the modulation, resulting fluctuations in input voltages supplied to the operational amplifier OP_AMP, can be suppressed. This allows an output voltage of the operational amplifier OP_AMP to be stabilized.

[Summary]

As has been described, the DC-coupled laser drive circuit in accordance with an embodiment of the present invention is a laser driver circuit for driving a laser diode device, and includes: a pre-driver for adjusting an amplitude of a voltage signal modulated by a data signal; a main driver for converting, into an electric current signal to be supplied to the laser diode device, a voltage signal whose amplitude has been adjusted by the pre-driver; a voltage drop section, provided between the pre-driver and a power source for supplying electric power to the pre-driver, in which an amount of a voltage drop is variable; and a voltage drop amount controlling section for controlling, in accordance with a voltage signal whose amplitude has been adjusted by the pre-driver, the amount of the voltage drop in the voltage drop section.

According to the configuration, the amount of a voltage drop in the voltage drop section is adjusted in accordance with a voltage signal whose amplitude has been modulated by the pre-driver. Therefore, it is possible to reduce the amount of the voltage drop in accordance with such an output voltage (a value of a voltage signal whose amplitude has been adjusted by the pre-driver), in a case where the output voltage is excessively low due to a reduction in a voltage of the power source. In contrast, it is possible to increase the amount of the voltage drop in accordance with such an output voltage in a case where the output voltage is excessively high due to an increase in the voltage of the power source.

Hence, it is made possible to avoid the problem with a conventional DC-coupled laser drive circuit, that is, the problem of inability to meet the operating condition of a certain element (such as a constant electric current source) while a power source voltage of a pre-driver is being at a minimum. This was caused by the fact that a voltage-drop amount was set so as to meet the operating condition of another certain element (such as a transistor) while the power source voltage is being at a maximum. This makes it possible to realize a DC-coupled laser drive circuit in which a pre-driver need not be subject to tight restrictions.

It is preferable to configure the DC-coupled laser drive circuit in accordance with the embodiment of the present invention such that the voltage drop amount controlling section controls the amount of the voltage drop in the voltage drop section such that the voltage signal whose amplitude has been adjusted by the pre-driver becomes not greater than a bias voltage of the laser diode device.

With the configuration, it is possible to meet an operating condition of a transistor, of all the elements constituting the main driver, which transistor has a base terminal and a collector terminal which are connected to the pre-driver and the laser diode device, respectively. The operating condition of the transistor can also be met even in a case where there is a fluctuation in the bias voltage of the laser diode device. This means that it is possible to realize a DC-coupled laser drive circuit in which neither a power source voltage of a pre-driver nor a bias voltage of a laser diode device needs to be subject to tight restrictions.

It is preferable to configure the DC-coupled laser drive circuit in accordance with the embodiment of the present invention such that: the voltage drop section includes a resistor, one end of which resistor is connected to the power source and the other end of which resistor is connected to the pre-driver; and the voltage drop amount controlling section includes: an operational amplifier which has (i) an inverting input terminal to which an average voltage of a non-inverted output of and an inverted output of the pre-driver is supplied and (ii) a non-inverting input terminal to which the bias voltage of the laser diode device is supplied; and a field-effect transistor which has (a) a gate terminal connected to an output terminal of the operational amplifier, (b) a drain terminal connected to a node between the voltage drop section and the pre-driver, and (c) a source terminal which is grounded.

The voltage drop section and the voltage drop amount controlling section can be realized with the configuration with such simplicity.

It is preferable to configure the DC-coupled laser drive circuit in accordance with the embodiment of the present invention such that: the voltage drop section includes a field-effect transistor that has a source terminal and a drain terminal connected to the power source and the pre-driver, respectively; and the voltage drop amount controlling section includes an operational amplifier that has (i) an inverting input terminal to which an average voltage of a non-inverted output of and an inverted output of the pre-driver is supplied, (ii) a non-inverting input terminal to which the bias voltage of the laser diode device is supplied, and (iii) an output terminal connected to a gate terminal of the field-effect transistor.

The voltage drop section and the voltage drop amount controlling section can be realized with the configuration with such simplicity. With the configuration, it is also possible to reduce power consumption since there is no possibility of electric current loss which tends to occur in the case of a voltage drop section made up of resistors.

It is preferable to configure the DC-coupled laser drive circuit in accordance with the embodiment of the present invention such that the bias voltage of the laser diode device is supplied to the voltage drop amount controlling section via another voltage drop section other than the voltage drop section.

With the configuration, it is possible to even more dependably meet the operating condition of the transistor that has a base terminal and a collector terminal which are connected to the pre-driver and the laser diode device, respectively. This is because a voltage at the base terminal of the transistor can be set lower than a voltage at the collector terminal of the transistor by only as much as the amount of a voltage drop in the voltage drop section.

It is preferable to configure the DC-coupled laser drive circuit in accordance with the embodiment of the present invention such that the voltage drop amount controlling section controls the amount of the voltage drop in the voltage drop section such that the voltage signal whose amplitude has been adjusted by the pre-driver becomes not greater than a predetermined reference voltage.

With the configuration, it is possible, in a case where the bias voltage of the laser diode device is higher than the reference voltage, to meet the operating condition of the transistor, of all the elements constituting the main driver, which transistor has a base terminal and a collector terminal which are connected to the pre-driver and the laser diode device, respectively. Even in a case where there is a fluctuation in the bias voltage of the laser diode device, setting the reference voltage to be lower than a minimum value of the fluctuation makes it possible to meet the operating condition of the transistor. This means that it is possible to realize a DC-coupled laser drive circuit in which neither a power source voltage of a pre-driver nor a bias voltage of a laser diode needs to be subject to tight restrictions.

It is preferable to configure the DC-coupled laser drive circuit in accordance with the embodiment of the present invention such that: the voltage drop section includes a resistor, one end of which resistor is connected to the power source and the other end of which resistor is connected to the pre-driver; and the voltage drop amount controlling section includes: an operational amplifier which has (i) an inverting input terminal to which an average voltage of a non-inverted output of and an inverted output of the pre-driver is supplied and (ii) a non-inverting input terminal to which the predetermined reference voltage is supplied; and a field-effect transistor which has (a) a gate terminal connected to an output terminal of the operational amplifier, (b) a drain terminal connected to a node between the voltage drop section and the pre-driver, and (c) a source terminal which is grounded.

The voltage drop section and the voltage drop amount controlling section can be realized with the configuration with such simplicity.

It is preferable to configure the DC-coupled laser drive circuit in accordance with the embodiment of the present invention such that: the voltage drop section includes a field-effect transistor whose source terminal and drain terminal are connected to the power source and the pre-driver, respectively; and the voltage drop amount controlling section includes an operational amplifier that has (i) an inverting input terminal to which an average voltage of a non-inverted output of and an inverted output of the pre-driver is supplied, (ii) a non-inverting input terminal to which the predetermined reference voltage is supplied, and (iii) an output terminal connected to a gate terminal of the field-effect transistor.

The voltage drop section and the voltage drop amount controlling section can be realized with the configuration with such simplicity. With the configuration, it is also possible to reduce power consumption since there is no possibility of electric current loss which tends to occur in the case of a voltage drop section made up of resistors.

A driving method in accordance with an embodiment of the present invention is a method for driving, with the use of a DC-coupled laser drive circuit, a laser diode device, said DC-coupled laser drive circuit including: a pre-driver for adjusting an amplitude of a voltage signal modulated by a data signal; a main driver for converting, into an electric current signal to be supplied to a laser diode device, a voltage signal whose amplitude has been adjusted by the pre-driver; a voltage drop section, provided between the pre-driver and a power source for supplying electric power to the pre-driver, in which an amount of a voltage drop is variable, said method including the step of controlling, in accordance with a voltage signal whose amplitude has been adjusted by the pre-driver, the amount of the voltage drop in the voltage drop section.

The configuration brings an advantageous effect similar to those brought by the configurations of the DC-coupled laser drive circuit.

[Additional Remark]

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention.

INDUSTRIAL APPLICABILITY

The present invention is widely applicable to DC-coupled laser drive circuits in general. In particular, the present invention is suitably employed as (i) a laser drive circuit to be mounted in an AOC (Active Optical Cable), (ii) a laser drive circuit for generating a burst signal in a PON (Passive Optical Network), and (iii) the like.

REFERENCE SIGNS LIST 1, 2 DC-coupled laser drive circuit
11, 22 Pre-driver
12, 22 Pre-driver
13, 23 Main driver
14, 24 Voltage drop section
15, 25 Constant electric current source
16, 26 Voltage drop amount controlling section
27 Constant voltage source

The invention claimed is:

1. A DC-coupled laser drive circuit comprising:
a pre-driver for adjusting an amplitude of a voltage signal modulated by a data signal;
a main driver, connected to a laser diode device without a capacitor in between, which converts, into an electric current signal to be supplied to the laser diode device, a voltage signal whose amplitude has been adjusted by the pre-driver;
a voltage drop section provided between the pre-driver and a power source for supplying electric power to the pre-driver, in which an amount of a voltage drop is variable; and
a voltage drop amount controlling section for controlling the amount of the voltage drop in the voltage drop section such that the voltage signal whose amplitude has been adjusted by the pre-driver and which is inputted to the main driver becomes not greater than a predetermined reference voltage.

2. The DC-coupled laser drive circuit as set forth in claim 1, wherein:
the voltage drop section includes a field-effect transistor whose source terminal and drain terminal are connected to the power source and the pre-driver, respectively; and
the voltage drop amount controlling section includes an operational amplifier that has (i) a non-inverting input terminal to which an average voltage of a non-inverted output of and an inverted output of the pre-driver is supplied, (ii) an inverting input terminal to which the predetermined reference voltage is supplied, and (iii) an output terminal connected to a gate terminal of the field-effect transistor.

3. The DC-coupled laser drive circuit as set forth in claim 1, wherein:
the voltage drop section includes a resistor, one end of which resistor is connected to the power source and the other end of which resistor is connected to the pre-driver; and
the voltage drop amount controlling section includes:
an operational amplifier which has (i) a non-inverting input terminal to which an average voltage of a non-inverted output of and an inverted output of the pre-driver is supplied and (ii) an inverting input terminal to which the predetermined reference voltage is supplied; and
a field-effect transistor which has (a) a gate terminal connected to an output terminal of the operational amplifier, (b) a drain terminal connected to a node between the voltage drop section and the pre-driver, and (c) a source terminal which is grounded.

4. The DC-coupled laser drive circuit as set forth in claim 1, wherein
the main driver is constituted by a pair of transistors, and
the voltage drop amount controlling section controls the amount of the voltage drop such that a voltage at a node between respective base terminals of the pair of transistors becomes not greater than the predetermined reference voltage.

5. A DC-coupled laser drive circuit comprising:
a pre-driver for adjusting an amplitude of a voltage signal modulated by a data signal;

a main driver, connected to a laser diode device without a capacitor in between, which converts, into an electric current signal to be supplied to the laser diode device, a voltage signal whose amplitude has been adjusted by the pre-driver;

a voltage drop section provided between the pre-driver and a power source for supplying electric power to the pre-driver, in which an amount of a voltage drop is variable; and a voltage drop amount controlling section for controlling the amount of the voltage drop in the voltage drop section such that the voltage signal whose amplitude has been adjusted by the pre-driver and which is inputted to the main driver becomes not greater than a bias voltage of the laser diode device.

6. The DC-coupled laser drive circuit as set forth in claim 5, wherein:

the voltage drop section includes a resistor, one end of which resistor is connected to the power source and the other end of which resistor is connected to the pre-driver; and the voltage drop amount controlling section includes:

an operational amplifier which has (i) a non-inverting input terminal to which an average voltage of a non-inverted output of and an inverted output of the pre-driver is supplied and (ii) an inverting input terminal to which the bias voltage of the laser diode device is supplied; and a field-effect transistor which has (a) a gate terminal connected to an output terminal of the operational amplifier, (b) a drain terminal connected to a node between the voltage drop section and the pre-driver, and (c) a source terminal which is grounded.

7. The DC-coupled laser drive circuit as set forth in claim 5, wherein:

the voltage drop section includes a field-effect transistor that has a source terminal and a drain terminal connected to the power source and the pre-driver, respectively; and the voltage drop amount controlling section includes an operational amplifier that has (i) a non-inverting input terminal to which an average voltage of a non-inverted output of and an inverted output of the pre-driver is supplied, (ii) an inverting input terminal to which the bias voltage of the laser diode device is supplied, and (iii) an output terminal connected to a gate terminal of the field-effect transistor.

8. The DC-coupled laser drive circuit as set forth in claim 5, wherein the bias voltage of the laser diode device is supplied to the voltage drop amount controlling section via another voltage drop section other than the voltage drop section.

9. The DC-coupled laser drive circuit as set forth in claim 5, wherein the main driver is constituted by a pair of transistors, and the voltage drop amount controlling section controls the amount of the voltage drop such that a voltage at a node between respective base terminals of the pair of transistors becomes not greater than the bias voltage of the laser diode device.

10. A method for driving a laser diode device, comprising the steps of:

(i) adjusting, with the use of a pre-driver, an amplitude of a voltage signal modulated by a data signal;

(ii) converting, by use of a main driver which is connected to a laser diode device without a capacitor in between, the voltage signal, whose amplitude has been adjusted in the step (i), into an electric current signal to be supplied to the laser diode device; and (iii) controlling the amount of the voltage drop in a voltage drop section provided between the pre-driver and a power source for supplying electric power to the pre-driver such that the voltage signal whose amplitude has been adjusted in the step (i) and which is inputted to the main driver becomes not greater than a predetermined reference voltage.

\* \* \* \* \*